(12) United States Patent
Zimmer

(10) Patent No.: US 7,618,074 B2
(45) Date of Patent: Nov. 17, 2009

(54) HANDLING APPARATUS FOR PASSING ELECTRONIC COMPONENTS, IN PARTICULAR ICS, TO A TESTING APPARATUS

(75) Inventor: Björn Zimmer, Grafing (DE)

(73) Assignee: Multitest Elektronische Systeme GmbH, Rosenheim (DE)

( * ) Notice: Subject to any disclaimer, the term of this patent is extended or adjusted under 35 U.S.C. 154(b) by 65 days.

(21) Appl. No.: 11/288,077

(22) Filed: Nov. 29, 2005

(65) Prior Publication Data

US 2006/0113808 A1   Jun. 1, 2006

(30) Foreign Application Priority Data

Nov. 30, 2004   (DE) .................. 10 2004 057 775

(51) Int. Cl.
*B25J 15/06* (2006.01)
(52) U.S. Cl. .......................... 294/2; 294/64.1
(58) Field of Classification Search .............. 294/2, 294/64.1; 29/743
See application file for complete search history.

(56) References Cited

U.S. PATENT DOCUMENTS

| | | | | |
|---|---|---|---|---|
| 3,579,795 | A | * | 5/1971 | Burman ..................... 29/252 |
| 4,381,601 | A | * | 5/1983 | Tamai et al. ................ 29/740 |
| 4,521,959 | A | * | 6/1985 | Sprenkle .................... 29/741 |
| 4,599,037 | A | * | 7/1986 | Ross et al. ................. 294/64.1 |
| 4,604,572 | A | | 8/1986 | Horiuchi et al. |
| 4,950,011 | A | * | 8/1990 | Borcea et al. ............. 294/64.1 |
| 5,174,016 | A | * | 12/1992 | Todd ........................ 29/762 |

FOREIGN PATENT DOCUMENTS

| | | |
|---|---|---|
| DE | 100 07 434 | 11/2000 |
| JP | 409199250 | * 7/1997 |

\* cited by examiner

*Primary Examiner*—Paul T Chin
(74) *Attorney, Agent, or Firm*—Nixon & Vanderhye P.C.

(57) ABSTRACT

In the case of a handling apparatus for passing electronic components, in particular ICs, which are provided in a component carrier, to a testing apparatus, a component holder having a positioning device is provided and has movable clamping elements which can be moved from an open position, in which they are at a distance from the side edges of the component, into a clamping position, in which they apply a pressure force, which prevents lateral movement of the component, to the side edges of the component.

7 Claims, 4 Drawing Sheets

HANDLING APPARATUS FOR PASSING ELECTRONIC COMPONENTS, IN PARTICULAR ICS, TO A TESTING APPARATUS

CROSS-REFERENCES TO RELATED APPLICATIONS

This application claims foreign priority benefits under 35 U.S.C. 119 of German Patent Application 10 2004 057 775.7 filed on Nov. 30, 2004.

FIELD

The technology herein relates to a handling apparatus for passing electronic components, in particular ICs, which are provided in a component carrier, to a testing apparatus, having a component holder which has a positioning device for laterally positioning the component in the component holder.

BACKGROUND AND SUMMARY

The electrical characteristics of electronic components such as integrated circuits (ICs) are usually tested before said ICS are mounted on printed circuit boards or fitted in devices. In this process, the electronic components are generally passed to an automatic handling machine ("handler") in component carriers which are particularly composed of aluminum plates and in which the components are held centered in precisely predetermined positions. The automatic handling machine has a handling apparatus with which the components are subsequently removed from the component carrier and passed to a testing device. Generally speaking, it is often necessary to precisely position the component in the component holder, since otherwise the many connection contacts of the component, which are designed to be very small and are close to one another, cannot be precisely applied to the corresponding connection contacts of the testing apparatus.

In order to laterally position the component within the component holder, it is known to provide a positioning frame on the component holder, the components coming to rest in said positioning frame when the component holder is placed onto the component carrier and the component is sucked up by means of a vacuum suction means. However, since the bodies of the components have specific dimensional tolerances, the size of the positioning frame generally has to be designed such that even the component with the largest permissible dimensions fit into the positioning frame. The majority of components therefore have a certain amount of lateral play within the positioning frame.

In order to be able to take this lateral play into account when passing the components to the testing device, it is also known to optically measure the components within the component holder immediately after they are removed from the component carrier, so that a corresponding position correction can be calculated and carried out, if necessary. However, the components are again laterally displaced within the positioning frame when they are subsequently transported to the testing device, with the result that the position of the component calculated during the optical measurement no longer corresponds to the actual position.

The exemplary illustrative non-limiting implementation provides a handling apparatus of the type mentioned in the introduction which has a positioning device which prevents lateral displacement of the components within the component holder in a simple and reliable manner.

In the case of the exemplary illustrative non-limiting handling apparatus, the positioning device has movable clamping elements which can be moved from an open position, in which they are at a distance from the side edges of the component, into a clamping position, in which they apply a pressure force, which prevents lateral movement of the component, to the side edges of the component.

The component, in one exemplary illustrative non-limiting implementation, is therefore clamped in the component holder in a non-positive manner by means of the positioning device, so that the component is held in the component holder without play and a subsequent lateral displacement of the component is reliably prevented. This ensures that the position assumed by the component in the component holder is exactly maintained after the component is taken out of the component carrier, up to the testing device and also even after the testing process, until the component is removed from the component holder. In this way, it is possible to pass the components to the corresponding connection contacts of the testing apparatus with a very high degree of precision, and satisfactory measurement results are ensured.

According to one exemplary illustrative non-limiting implementation, the positioning device has at least two clamping elements which act at right angles to one another and can be moved to bear with pressure against two adjacent side edges of the component. It is therefore fundamentally possible to provide two fixed side stops which are arranged at an angle of 90° in relation to one another and to allow two clamping elements, which apply the necessary pressure force to the component, to engage on the opposite side edges of the component. However, it is particularly advantageous when the positioning device has two pairs of opposite clamping elements which act at right angles to one another as in certain exemplary illustrative non-limiting implementations, so that the clamping elements apply a corresponding pressure force to the component from all four sides. This ensures insertion of the component into the accommodation space of the component holder without obstacles and without a relatively large lateral displacement of the component then being necessary.

A very cost-effective exemplary illustrative non-limiting implementation results when the clamping elements are pre-stressed in their clamping position by means of springs which produce the required clamping force. This therefore involves "passive" clamping of the components, that is to say no additional energy need be expended to move the clamping elements in the desired manner. However, it is also possible to move the clamping elements between the open and clamping positions "actively", that is to say by supplying external energy.

According to an exemplary illustrative non-limiting implementation, the clamping elements comprise pivotable L-shaped pivot levers. This allows an arrangement and kinematics system to be implemented within the component holder in a very simple manner, in the case of which firstly a sufficiently large lateral clearance is created in the open position to be able to insert the component into the associated accommodation space of the component holder without obstacles, and secondly with which the component can be firmly clamped with the required force after the insertion process.

In another exemplary illustrative non-limiting implementation, each pair of opposite clamping elements has one clamping element which exerts a greater pressure force on the component than the opposite clamping element and interacts with a stop face which stops the movement of the clamping element in a predetermined position. This ensures that the component always assumes a defined setpoint position within the component holder in a simple manner, since the clamping elements with the greater pressure force are first always pivoted so far into their clamping position until they bear against the stop face, while the opposite clamping elements with the lower pressure force yield correspondingly far, but without giving up their pressing effect on the components.

In a further exemplary illustrative non-limiting implementation, the component holder has a stop face which can be moved to bear against the component carrier and serves to limit the advancing movement of said component holder in the direction of the component carrier. The clamping elements each have an operating protrusion which projects beyond the bearing face in the direction of the component carrier when the component holder is removed from the component carrier, and can be moved by the component carrier in the direction of the bearing face when the component holder is placed onto the component carrier, as a result of which the clamping elements are moved to their open position. In this case, the advancing movement of the component holder, that is to say the lowering of the component holder onto the component carrier, is therefore used to open the clamping elements, whereas the lifting movement of the component holder after the component is sucked up is used to release the clamping elements so that the prestressing force of the springs or other force-generating elements can move the clamping elements in the direction of their clamping closed position.

BRIEF DESCRIPTION OF THE DRAWINGS

These and other features and advantages will be better and more completely understood by referring to the following detailed description of exemplary non-limiting illustrative implementations in conjunction with the drawings of which.

DETAILED DESCRIPTION

Figure 1:
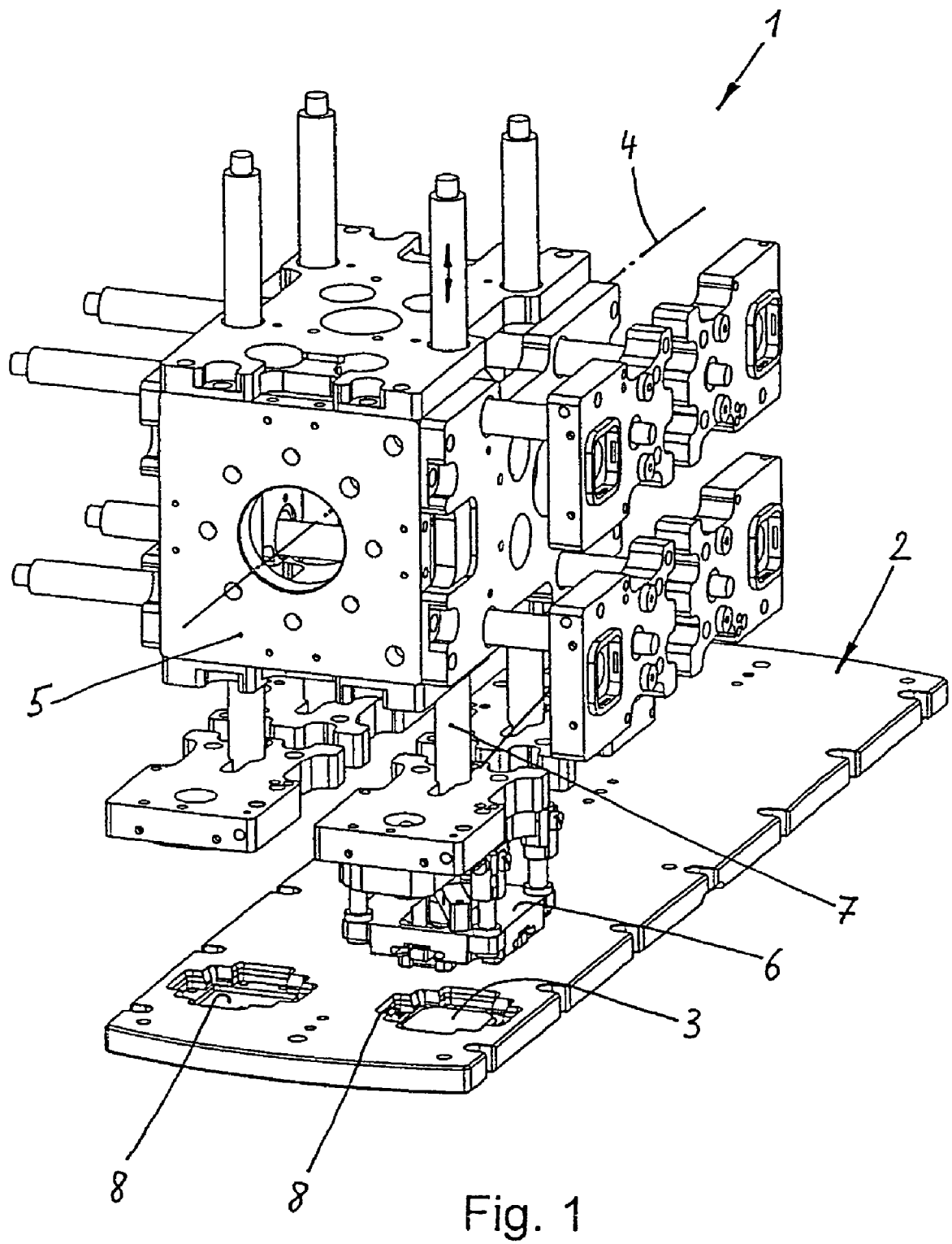
FIG. 1 shows a perspective illustration of the handling apparatus according to an exemplary illustrative non-limiting implementation with a component carrier lying under it after a component is picked up.

FIG. 1 shows the important parts of a handling apparatus 1 for grasping and holding electronic components 3 in the form of ICs and provided in a component carrier 2, in order to be able to pass these components 3 to a testing apparatus (not illustrated).

As can be seen, the handling apparatus 1 has a base body 5 which can be pivoted about a horizontal pivot axis 4, and a multiplicity of component holders 6 which are each attached to the end of a push-rod 7. The push-rods 7 can be mounted such that they can be longitudinally displaced within the base body 5, so that they can execute a corresponding lifting movement together with the component holders 6 in a known manner.

In the exemplary implementation illustrated in FIG. 1, four component holders 6 which can be moved independently of one another are arranged on two sides of the base body 5 in each case. However, for the sake of clarity, only one single component holder 6 is shown. The component carrier 2 which usually comprises a steel plate is also not shown in its entirety since only two recesses 8 which serve to accommodate the components 3 are illustrated. A large number of such recesses 8 are usually arranged along the component carrier 2.

The handling apparatus 1 illustrated in FIG. 1 is used to firstly remove the component 3 in the right-hand recess 8 (or the components in a multiplicity of further recesses 8 which are not shown) from the component carrier 2 in the vertical direction, then pivot it through 90° together with the entire base body 5, and then pass it to a testing apparatus (not shown) in the horizontal direction. After the measurement is carried out, the base carrier 5 is pivoted such that the components 3 can again be inserted into free recesses 8 (the left-hand recess 8 in FIG. 1).

Figure 6:
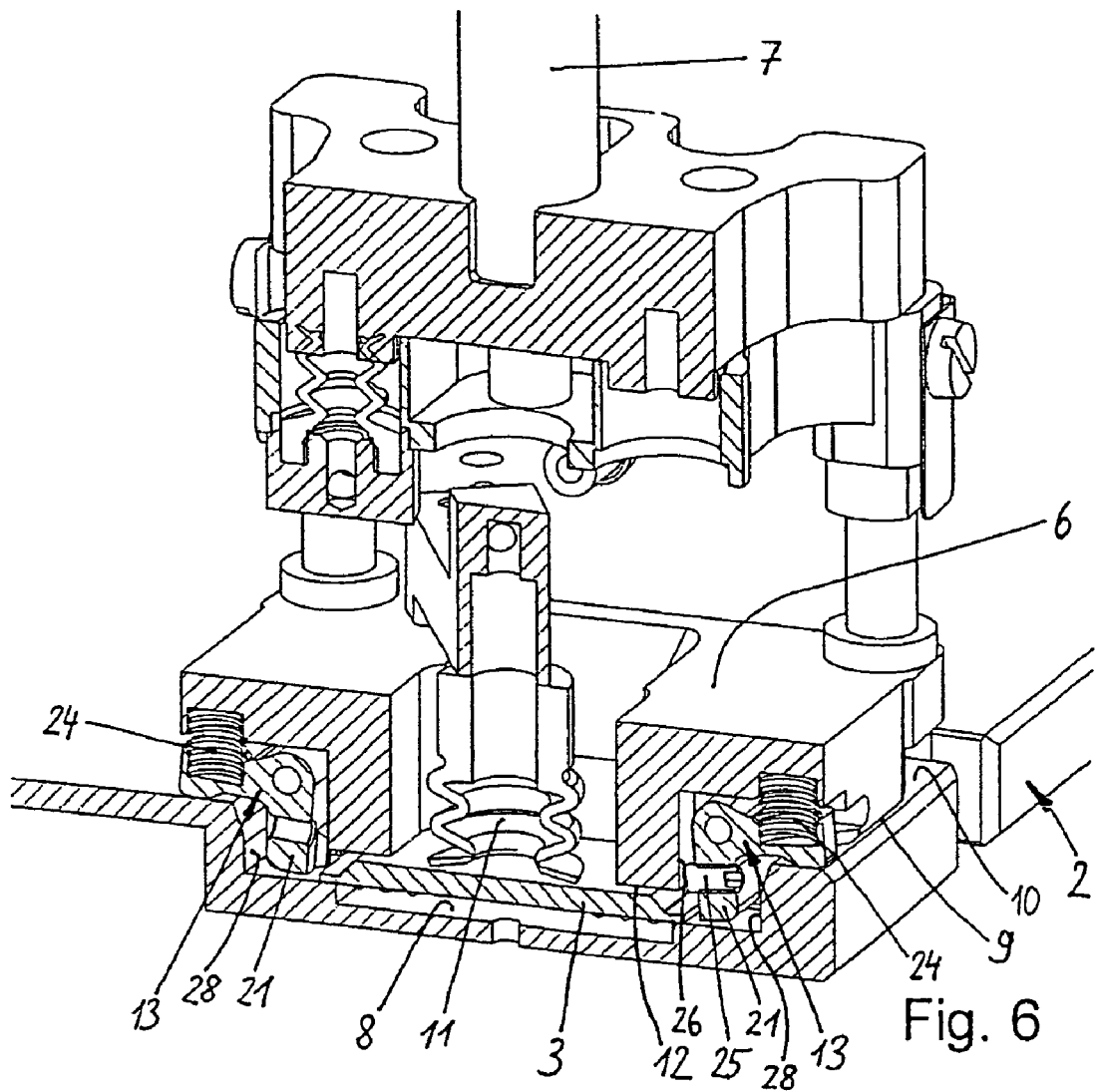
FIG. 6 shows a perspective section through the exemplary illustrative non-limiting component holder when it is placed onto a component carrier.
Figure 7:
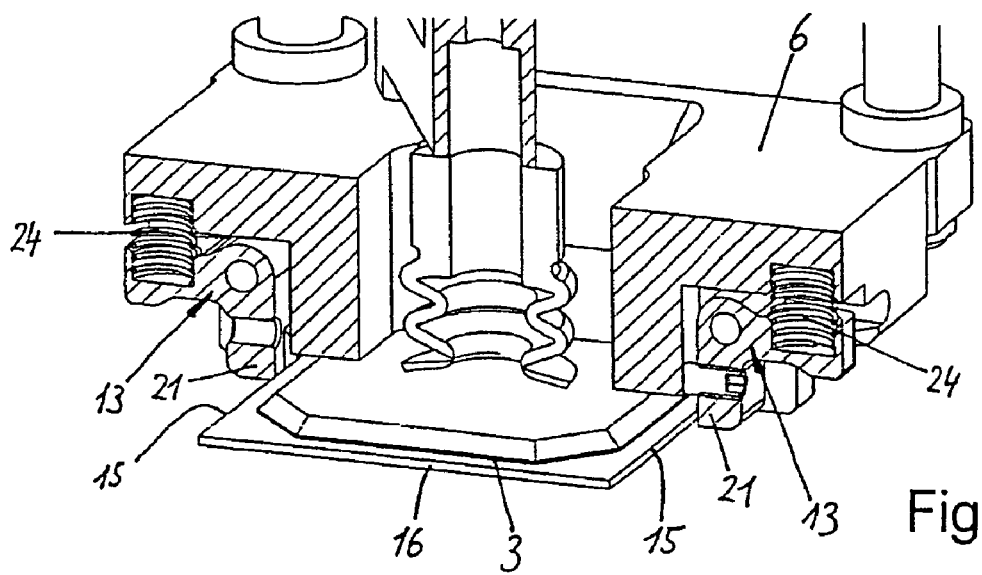
FIG. 7 shows only the exemplary illustrative non-limiting component holder from FIG. 6 after a component is sucked up and firmly clamped.

FIG. 6 illustrates the insertion of a component holder 6 into a recess 8 for accommodating a component 3 in greater detail. The component holder 6 is lowered so far downward by means of the push-rods 7 until a lower bearing face 9 of the component holder 6 rests on the surface 10 of the component carrier 2. A subatmospheric pressure is then produced within a vacuum suction means 11 which is placed onto the component 3 from above, so that the component 3 is drawn upward until it bears against a lower bearing face 12 of the component holder 6. The component 3 can now be removed from the associated recess 8 by pulling the component holder 6 upward, as can also be seen from FIG. 7.

In order to position the component 3 on the lower face of the component holder 6 in the lateral direction, the component holder 6 has a positioning device with clamping elements 13, 14 which can be moved from an open position, in which they are at a distance from the four side edges 15, 16 of the component 3 (FIG. 6), into a clamping position, in which they apply a pressure force, which prevents lateral movement of the component 3, to the side edges 15, 16 of the component 3 (FIGS. 2 to 5, FIG. 7). The clamping elements 13, 14 are in the form of L-shaped clamping levers which are pivotably mounted on a base plate 19 of the component holder 6 by means of pivot shafts 17. The pivot shafts 17 run parallel to the main plane of the base plate 19 here.

Figure 2:
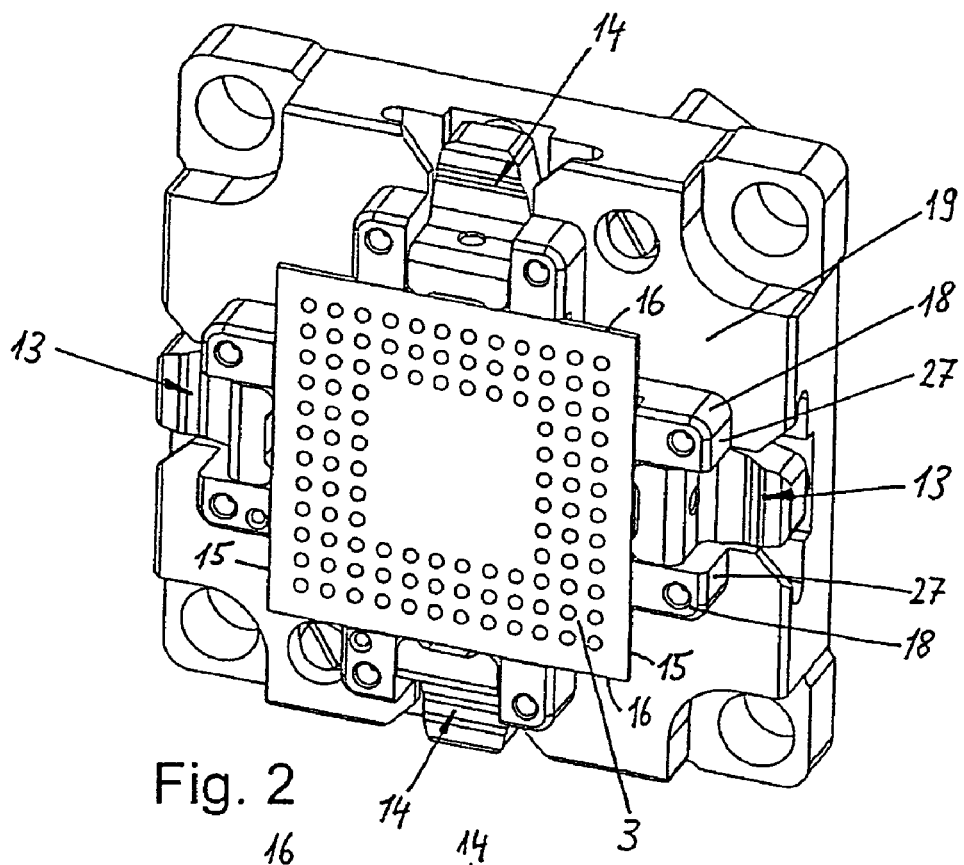
FIG. 2 shows an oblique perspective illustration from below of only the exemplary illustrative non-limiting component holder with a firmly clamped component.

As can be seen from FIG. 2 in particular, the clamping elements 13, 14 are each arranged between a pair of centering brackets 18 which project downward beyond the bearing face 9 of the component holder 6 and have centering faces 28 on their outer sides. These centering faces 28 interact with vertical side faces 28 (FIG. 6) of the recesses 8 of the component carrier 2 in order to laterally center the component holder 6 when it is placed onto the component carrier.

Figure 3:
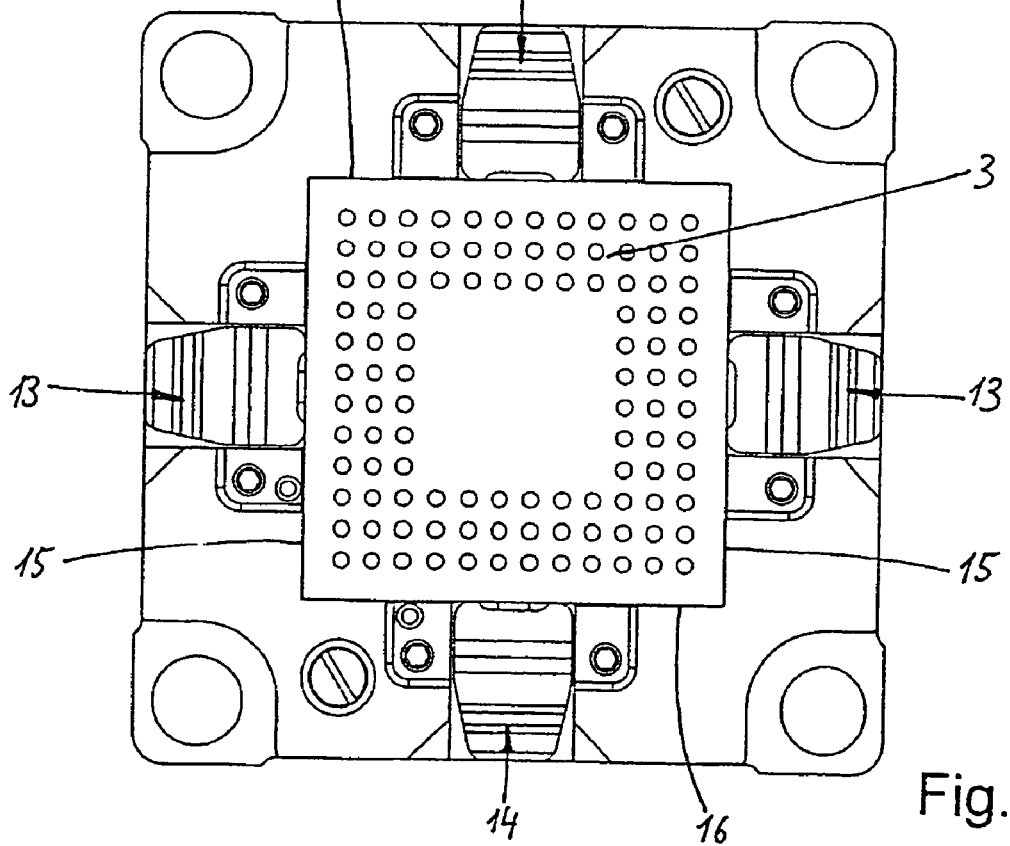
FIG. 3 shows a view of the exemplary illustrative non-limiting component holder from FIG. 2 from below.
Figure 4:
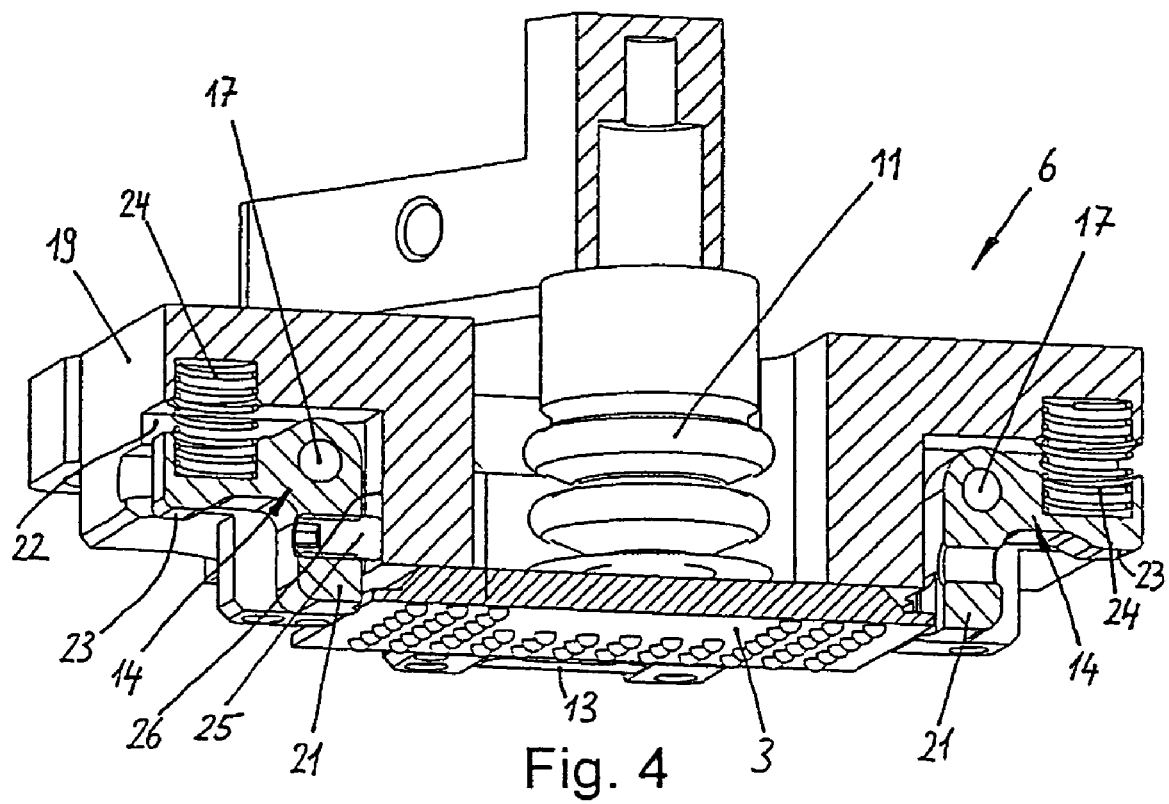
FIG. 4 shows a perspective section through the exemplary illustrative non-limiting component holder from FIG. 2.
Figure 5:
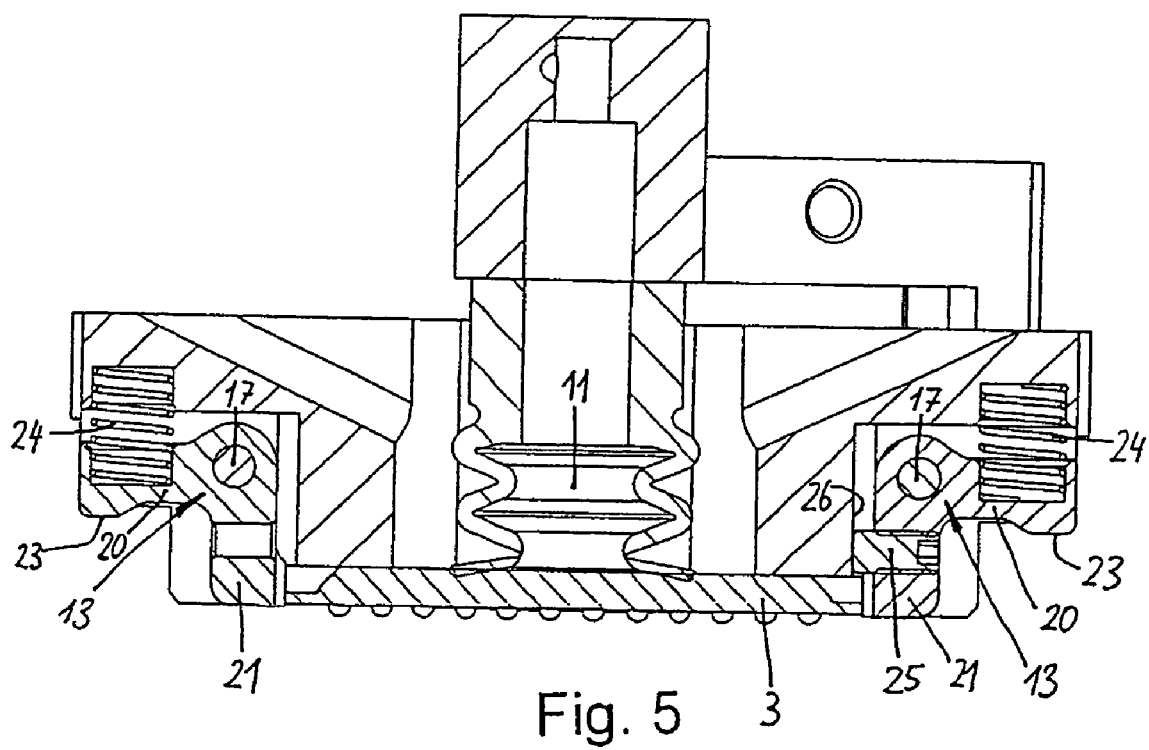
FIG. 5 shows a vertical section through the exemplary illustrative non-limiting component holder from FIG. 2, with the sectional face being in a plane which is offset through 90° compared to FIG. 4.

As can be seen from FIGS. 2 and 3, the positioning device has two pairs of opposite clamping elements 13, 14 which act at right angles to one another. In this case, the two clamping elements 13 engage from the opposite sides on the two side edges 15 of the component 3, whereas the two clamping elements 14 engage from opposite sides on the two parallel side edges 16 of the component 3. The component 3 can therefore be clamped in by the clamping elements 13, 14 from all four sides.

As can be seen from FIGS. 4 to 7, the clamping elements 13, 14, which are essentially identical, have one operating limb 20, which is arranged horizontally in the position shown, and one clamping limb 21 which is arranged vertically. In this case, the clamping elements 13, 14 are arranged in associated cutouts 22 (FIGS. 4 and 5) in the base plate 19, which are open at the bottom, in such a way that in a raised position of the component holder 6 at least one downwardly projecting operating protrusion 23 of the operating limb 20 projects downward beyond the bearing face 9 of the component holder 6, and the operating protrusion 23 can be fully pushed back upward into the associated cutout 22 by the component carrier 2 when the component holder 6 is placed onto said component carrier 2 (FIG. 6).

The lower ends of the clamping limbs 21, which project downward beyond the bearing face 12 of the component holder 6 by an extent which corresponds at least substantially to the thickness of the component 3, are therefore pivoted laterally outward when the component holder 6 is placed onto the component carrier 2, so that there is a lateral clearance from the side edges 15, 16 of the component 3 and the lower ends of the clamping limbs 21 can be positioned next to the side edges 15, 16 of the component 3.

When the component holder 6 is lowered, the clamping elements 13, 14 are opened against the prestressing force of springs 24 which are arranged between the operating limbs 20 of the clamping elements 13, 14 and the base plate 19 of the component holder 6 and which try to push the operating limbs 20 permanently downward, with the result that they apply a permanent prestressing force on the clamping elements 13, 14 in the closing direction. If the component holder 6 is lifted off from the component carrier 2 again after being placed onto it, the clamping limbs 21 of the clamping elements 13, 14 are pivoted inward by the prestressing force of the springs 24, with the result that they exert a pressure force on the side edges 15, 16 of the component 3 and position it on all four sides.

In order to ensure accurate placement and centering of the component 3 in the component holder 6, stops 25 are provided on two clamping elements 3 which are arranged on adjacent sides. As illustrated, these stops 25 may comprise grub screws or studs which can be screwed into corresponding threaded holes in the clamping limb 21 to a greater or lesser extent and project inward beyond the clamping limb 21, so that they can strike a vertical stop face 26 of the base plate 19 and thus limit the pivoting movement 21 in the inward direction. Furthermore, those springs 24 which act on the two clamping elements 13, 14 with the stops 25 are designed to be stronger than the two springs 24 arranged on the opposite sides, so that the clamping elements 13, 14 with the stops 25 are always pivoted inward until the stops 25 bear against the stop faces 26. In this way, the component 3 is laterally displaced in a defined manner until it reaches a predetermined position, it being possible for the clamping elements 13, 14 arranged on the opposite sides to yield in a corresponding manner. The component 3 thus lies in a predetermined setpoint position within the component holder 6 such that it is centered, with the clamping elements 13, 14 exerting a permanent lateral force on the component 3 and thus fixing it laterally, while the retaining force is applied predominantly by the vacuum suction means 11 in the vertical direction.

While the technology herein has been described in connection with exemplary illustrative non-limiting implementations, the invention is not to be limited by the disclosure. The invention is intended to be defined by the claims and to cover all corresponding and equivalent arrangements whether or not specifically disclosed herein

The invention claimed is:

1. Handling apparatus for passing electronic components such as ICs to a testing apparatus, said components having side edges, said components being provided in a component carrier, said handling apparatus passing said components to the testing apparatus comprising a component holder which has a positioning device for laterally positioning the component in the component holder, the positioning device comprising movable clamping elements which can be moved from an open position, in which said movable clamping elements are at a distance from the side edges of the component, into a clamping position, in which said movable clamping elements apply a pressure force, which prevents lateral movement of the component, to the side edges of the component, each clamping element being urged towards its clamping position by means of a spring;

wherein the clamping elements each comprise an operating protrusion which is held by spring in a position protruding towards the component carrier when the component holder is positioned distantly to the component carrier and which can be moved by the component carrier when the component holder is placed onto the component carrier, as a result of which the clamping elements are moved to their open position, the clamping elements being moved into the opening position by placing the component holder onto the component carrier thereby pushing the operating protrusions against the biasing force of springs, wherein the operating protrusions extend outwardly.

2. Handling apparatus according to claim 1, wherein said components each include two adjacent side edges, and the positioning device comprises at least two clamping elements which act at right angles to one another and can be moved to bear with pressure against two adjacent side edges of the component.

3. Handling apparatus according to claim 1, wherein the positioning device comprises two pairs of opposite clamping elements which act at right angles to one another.

4. Handling apparatus according to claim 3, wherein each pair of opposite clamping elements comprises first and second opposing clamping elements, said first clamping element exerting a greater pressure force on the component than the second clamping element and interacting with a stop face which stops the movement of the clamping element in a predetermined position.

5. Handling apparatus according to claim 1, wherein the clamping elements are prestressed in their clamping position by means of springs.

6. Handling apparatus according to claim 1, wherein the clamping elements comprise pivotable L-shaped pivot levers.

7. A component handling apparatus for handling a component having side edges and which is disposed within a component carrier, said component handling apparatus including a positioning device that positions a component holder;

the component holder having moveable clamping elements which can be moved from an open position to a clamping position, a spring associated with each moveable clamping element urging said associated clamping element towards its clamping position, the clamping elements when at said open position being disposed at a distance from the component side edges, the clamping elements when in said clamping position applying a compressive force to the component side edges to reduce lateral movement of the component, wherein the clamping elements each comprise an operating protrusion and a spring that biases said clamping element in a position protruding towards the component carrier when the component holder is positioned distantly to the component carrier, the clamping elements moving to their open position in response to contact between said clamping element operating protrusions and the component carrier when the component holder is placed onto the component carrier, thereby pushing the operating protrusions against the biasing force of springs,
wherein the operating protrusions extend outwardly.

* * * * *